United States Patent [19]

Goesele et al.

[11] Patent Number: 4,883,215

[45] Date of Patent: Nov. 28, 1989

[54] METHOD FOR BUBBLE-FREE BONDING OF SILICON WAFERS

[75] Inventors: Ulrich M. Goesele; Reinhard J. Stengl, both of Durham, N.C.

[73] Assignee: Duke University, Durham, N.C.

[21] Appl. No.: 286,460

[22] Filed: Dec. 19, 1988

[51] Int. Cl.[4] .......................................... H01L 21/304
[52] U.S. Cl. ..................................... 228/116; 156/281; 156/306.3; 437/247; 148/DIG. 12; 228/903
[58] Field of Search ................ 228/116, 903; 156/281, 156/306.3; 148/DIG. 12; 437/246, 247

[56] References Cited

U.S. PATENT DOCUMENTS

| | | | |
|---|---|---|---|
| 3,595,719 | 7/1971 | Pomerantz | 156/629 |
| 4,247,352 | 1/1981 | Stupp et al. | 156/306.3 |
| 4,273,282 | 6/1981 | Norvell et al. | 228/116 |
| 4,771,016 | 9/1988 | Bajor et al. | 437/180 |
| 4,774,196 | 9/1988 | Blanchard | 437/247 |

OTHER PUBLICATIONS

Frye et al., "A Field-Assisted Bonding Process for Silicon Dielectric Isolation", from *J. Electrochem Society: Solid-State Science & Technology*, vol. 133, No. 8, pp. 1673–1677.
Shimbo et al.; "Silicon-to-Silicon Direct Bonding Method"; 10/15/86; Journal of Applied Physics, vol. 60, No. 8, pp. 2987–2989.
Black et al.; "Silicon and Silicon Dioxide Thermal Bonding for Silicon-on-Insulator Application"; 4/15/88; J. of App. Phys., vol. 63, No. 8, pp. 2773–2777.
Anthony; "Dielectric Isolation of Silicon by Anodic Bonding"; 8/1/85; J. of Appl. Phys., vol. 53, No. 3, pp. 1240–1247.
Lasky; "Wafer Bonding for Silicon-on-Insulator Technologies"; 1/16/86; J. of App. Phys., vol. 48, No. 1, pp. 78–80.

*Primary Examiner*—Kenneth J. Ramsey
*Attorney, Agent, or Firm*—Richard E. Jenkins

[57] ABSTRACT

A method for bubble-free bonding of silicon wafers to silicon wafers or silicon wafers to quartz wafers either outside or inside a Clean Room. The method includes the steps of positioning wafers in closely spaced-apart and parallel relationship to each other in a rack or the like with mirror-polished surfaces of the wafers facing each other, cleansing the mirror-polished surfaces with a hydrophilization cleansing solution, flushing the cleansing solution from the mirror-polished surfaces of the wafers with deionized water, drying the wafers in a spin-dryer, and moving the wafers together so that contact occurs between opposing mirror-polished surfaces of the wafers and bonding occurs.

32 Claims, 3 Drawing Sheets

METHOD FOR BUBBLE-FREE BONDING OF SILICON WAFERS

DESCRIPTION

1. Technical Field

This invention relates to a method for bonding a silicon wafer to another silicon wafer or to a glass wafer, and more particularly to an improved method for bubble-free bonding of a silicon wafer to another silicon wafer or to a glass wafer which can be accomplished either outside or inside of Clean Room facilities.

2. Background Art

Recently, as is known to those familiar with semiconductor microchip manufacturing technology, wafer bonding has been developed as a method for bonding large area oxidized or non-oxidized silicon wafers. Since wafer bonding makes it possible to bury oxide and implantation layers within the bulk of a monocrystalline silicon wafer, it may be a low cost and highly flexible alternative for silicon-on insulator (SOI) and epitaxial applications. Silicon direct bonding (SDB) may also lead to new device structures in the fields of power devices and sensors.

However, in spite of its apparent simplicity there is at least one major obstacle to overcome before wafer bonding can be considered as a reliable technique to produce SOI wafers for electronic devices or for other possible applications. The obstacle is bonding voids or "bubbles" which form at the interface of the mated wafers and are detrimental to the efficacy of the bond. Applicant has developed a novel and simple procedure relating to this obstacle which serves to eliminate interface bubbles at the mated wafer interface and which does not mandate that the procedure be performed in a Clean Room.

Interface bubbles are caused by dust or other particles and insufficient wafer flatness. While the latter case can be excluded by appropriate wafer specification, it is difficult to realize totally particle-free wafer surfaces prior to the bonding procedure. It has been found that, even for wafers mated in a Class 1 Clean Room, almost all of the wafers contain one or more bubbles due to enclosed particles of less than 1 micrometer (um) in size. Although the complete absence of bubbles may not be necessary for manufacturing power devices from bonded wafers, it is necessary for SOI applications and desirable for all applications. In order to produce completely void-free wafer pairs more complicated techniques rely on high pressure and annealing techniques after wafer bonding and, contrary to the findings of some researchers in this field, applicant has not found that the bubbles vanish when wafer pairs are annealed above 1000° Centigrade (C.). Instead, it was found that basically all the voids introduced during the bonding process at room temperature remain during the annealing step.

DISCLOSURE OF THE INVENTION

In accordance with the present invention, applicant provides a novel bubble-free method for bonding silicon wafers or silicon and quartz wafers wherein each of the wafers has at least one mirror-polished surface. The method includes the steps of positioning the wafers to be bonded in closely spaced-apart and parallel relationship with each of the wafers having a mirror-polished surface opposing a mirror-polished surface of the other wafer, introducing a cleansing solution onto the opposing mirror-polished surfaces of the wafers, flushing the cleansing solution from the mirror-polished surfaces of the wafers, drying the mirror-polished surfaces of the wafers, and moving the wafers together so that contact occurs between the opposing mirror-polished surfaces of the wafers and bonding therebetween occurs. Surprisingly, the process can be practiced and bubble-free wafer bonding achieved outside of a Clean Room environment, although the invention may still be practiced in a Clean Room.

It is therefore the object of this invention to provide a new and improved method for bubble-free bonding of silicon wafers to silicon wafers or silicon wafers to glass wafers.

It is another object of the present invention to provide a new method for bonding silicon wafers to silicon wafers or silicon wafers to glass wafers which does not have to be performed in a Clean Room environment.

Some of the objects of the invention having been stated, other objects will become evident as the description proceeds, when taken in connection with the accompanying drawings.

BEST MODE FOR CARRYING OUT THE INVENTION

Figure 1:
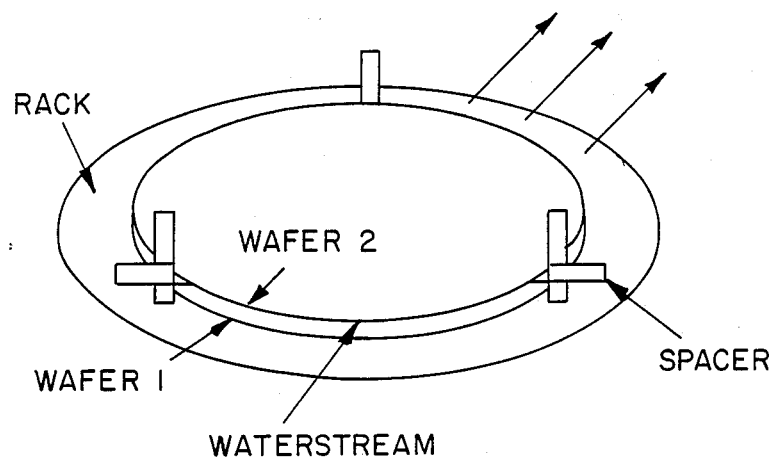
FIG. 1 is a schematic view of the wafer cleansing step of the present invention depicting water being utilized to flush the cleansing solution from the opposing mirror-polished wafer surfaces of a wafer pair while a rack containing the wafers is rotated.
Figure 2:
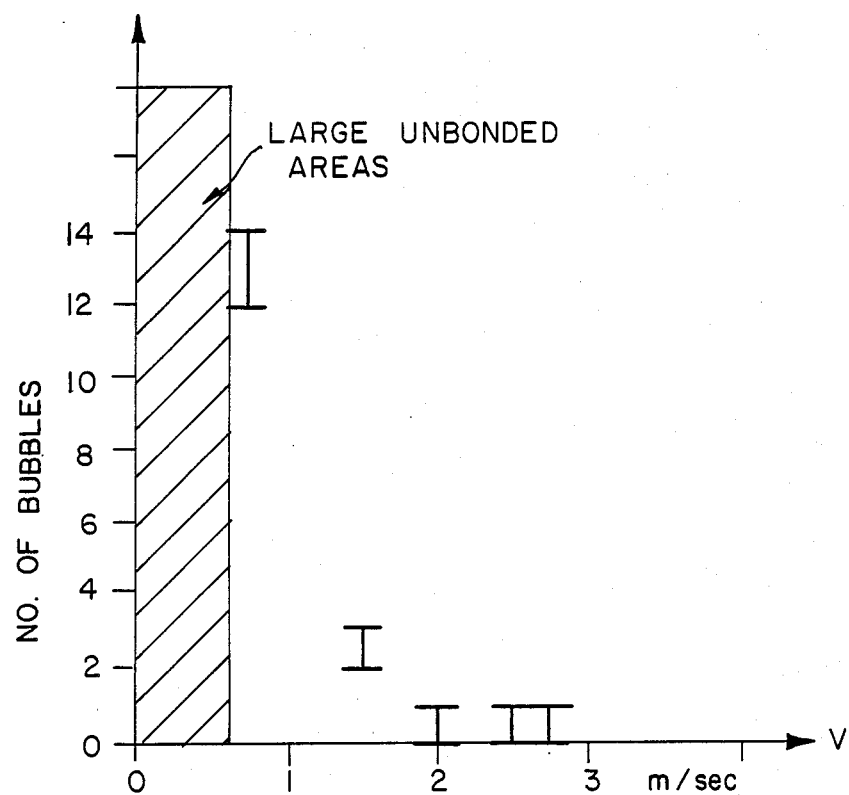
FIG. 2 is a graph depicting the number of wafer bonding bubbles versus water input velocity at the gap between the wafers during the flushing step of the present invention (wherein the wafers are spaced-apart 550 um and are dried in 2.5 minutes at a spin-dryer speed of 2,800 revolutions per minute (r.p.m.) so that final wafer temperature after drying is 45° C.)
Figure 3:
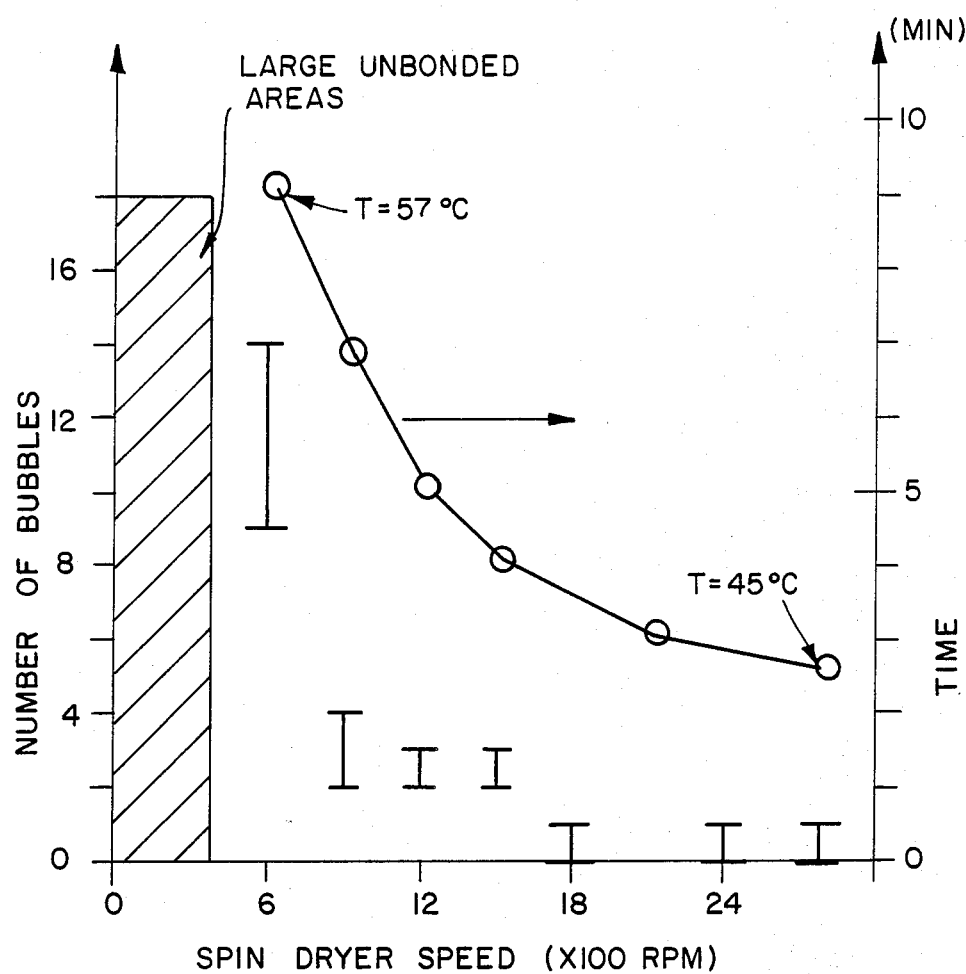
FIG. 3 is a graph of the drying time for a wafer pair in a spin-dryer and the number of bubbles in the bond versus spin-dryer speed (wherein the gap between the wafers is 550 um and the final wafer temperature after drying and heating is noted at 2 data points).

Referring to FIGS. 1-3 of the drawings, in a preferred embodiment of the present invention, prior to bonding a pair of wafers are treated according to the following procedure: Two mirror-polished 4 inch wafers (prime grade, thickness 350–550 um) are stacked horizontally on top of each other in a teflon rack or other suitable structure with the two mirror-polished surfaces facing each other. In order to avoid wafer contact during hydrophilization cleansing and flushing, the two wafers are separated by teflon (or other inert material) spacers having a thickness of about 550 um which are introduced at the wafer edges (although vacuum chucks or the like could also be utilized to effect wafer separation). The spacers should maintain the wafers at a spaced-apart distance of between about 10–1,000 um. The rack with the wafers is then immersed in a 550 milliliter (ml) hydrophilization bath of 300 ml of $H_2O$, 50 ml of $H_2O_2$, 200 ml of $NH_4OH$ at a temperature of between 50° C. and 60° C. for about 2–5 minutes. Then, the gap between the wafers is flushed in a flowing stream of thoroughly filtered water for about 5 minutes (see FIG. 1). For actual commercial application of the process deionized water should be used to flush the wafer surfaces. The velocity (v) of the water stream has been found to influence the number of bubbles between the two mated wafers after the bonding process as shown in FIG. 2. Preferably, the wafers are rotated relative to the water stream or the water stream rotated relative to the wafers.

As is well known to those familiar with the art, some wafers are treated in a hydrophilization bath or the like by the wafer manufacturer prior to shipment thereof. In order to bond these wafers, applicant contemplates that the rack of stacked wafers would only be subjected to the water flushing step described hereinabove since the hydrophilization bath would not be necessary in order to fully cleanse the mirror-polished wafer surfaces.

After flushing the wafers with water, the rack is centered horizontally on a spin-dryer and covered with a plastic cap so water can still escape through slits at the edge of the rack. A typical spin-drying rotational speed has been found to be about 3,000 r.p.m. Depending on the revolutions per minute rotational speed of the spin-dryer and the wafer temperature, the drying time varies in the range of minutes. Also, it has been found that the drying time can be reduced by a factor of four or more when during spinning the wafers are heated with an infrared lamp to about 45° C. or more. FIG. 3 shows the drying time for the wafers versus spin-dryer speed. It should be noted that the final temperature of the wafers at higher spin-dryer speeds is slightly lower due to the shorter heating time. After drying, the teflon spacers are pulled out radially and bonding between the two wafers occurs after contact has been made therebetween at some point between the two mirror-polished surfaces. The bonding process is accomplished by pressing the wafers together at one spot from which the wafer bonding contact wave proceeds to completion.

After bonding, the wafers may be inspected with an infrared viewer utilizing an S1 cathode that is sensitive to infrared radiation in the 0.8 to 1.2 um-region. When viewing the silicon wafers in front of a strong infrared light source, an IR interference image with approximately 1 um resolution of the bonded interface can be obtained. Using this observation technique, applicant developed the data set forth in FIG. 3, which depicts the number of observed bubbles as well as drying time as a function of the spin-dryer speed. It can be seen in FIG. 2 as well as in FIG. 3 that with sufficiently high water input velocity and spin-dryer speed, bubble-free bonding can be achieved. Applicant has used error bars of 0-1 bubbles in FIGS. 2 and 3 of the drawings since some of the bonded wafers may still contain one bubble near the region where the teflon spacers had been originally located.

Applicant has invented a method for bubble-free wafer bonding that may be practiced outside of a Clean Room. This should enable university laboratories and the like to explore the promising possibilities of wafer bonding without being restricted by financial or other complications or the time lag often associated with the use of appropriate Clean Room facilities. It also means that companies, such as wafer manufacturers, which generally use Clean Rooms with less restrictions on the particle density can make use of the advantages of wafer bonding.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for bonding at least two wafers wherein said at least two wafers includes at least one first wafer comprising silicon and at least one second wafer comprising either silicon or glass wherein each of said wafers has at least one mirror-polished surface, including the steps of:
   positioning said first and second wafers in closely spaced-apart and parallel relationship to each other and with each of said wafers having a mirror-polished surface opposing a mirror-polished surface of the other wafer;
   introducing a cleansing solution onto the opposing mirror-polished surfaces of said first and second wafers;
   flushing said cleansing solution from said mirror-polished surfaces of said first and second wafers;
   drying said mirror-polished surfaces of said first and second wafers;
   moving said first and second wafers together so that contact occurs between said opposing mirror-polished surfaces of said first and second wafer.

2. A method according to claim 1 wherein said first wafer is a silicon wafer and said second wafer is a silicon wafer.

3. A method according to claim 1—wherein said first wafer is a silicon wafer and said second wafer is a glass wafer.

4. A method according to claim 3 wherein said glass wafer is a quartz wafer.

5. A method according to claim 1 wherein said first and second wafers are maintained in said spaced-apart relationship by inert spacer elements positioned adjacent the perimeter of said wafers.

6. A method according to claim 5 wherein said spacer elements maintain a distance of about 10–1,000 um between said wafers.

7. A method according to claim 1 wherein said cleansing solution is a hydrophilization bath comprising by volume about 55% $H_2O$, 9% $H_2O_2$ and 36% $NH_4OH$ at a temperature of about 50° C.–60° C.

8. A method according to claim 7 wherein said wafers are immersed in said hydrophilization bath for about 2–5 minutes.

9. A method according to claim 1 wherein said wafers are flushed with a stream of filtered water.

10. A method according to claim 1 wherein said wafers are flushed with deionized water.

11. A method according to claim 1 wherein said wafers are dried by spin-drying.

12. A method according to claim 11 wherein said wafers are heated with an infrared lamp to a temperature of about 45° C. or more during said spin-drying process.

13. A method for bonding at least two wafers wherein said at least two wafers includes at least one first wafer comprising silicon and at least one second wafer comprising either silicon or glass wherein each of said wafers has at least one mirror-polished surface, including the steps of:
   positioning said first and second wafers in closely spaced-apart and parallel relationship to each other with inert spacer elements adjacent the perimeter of said wafers and with each of said wafers having a mirror-polished surface opposing a mirror-polished surface of the other wafer;

introducing a hydrophilization cleansing solution onto the opposing mirror-polished surfaces of said first and second wafers;

flushing said cleansing solution from said mirror-polished surfaces of said first and second wafers with deionized water;

spin-drying said mirror-polished surfaces of said first and second wafers;

removing said spacer elements from contact with the perimeter of said first and second wafers and moving said first and second wafers together so that contact occurs between said opposing mirror-polished surfaces of said first and second wafers.

14. A method according to claim 13 wherein said first wafer is a silicon wafer and said second wafer is a silicon wafer.

15. A method according to claim 13 wherein said first wafer is a silicon wafer and said second wafer is a glass wafer.

16. A method according to claim 1 wherein said glass wafer is a quartz wafer.

17. A method according to claim 13 wherein said inert spacer elements maintain a distance of about 10–1,000 um between said wafers.

18. A method according to claim 13 wherein said hydrophilization cleansing solution is a bath comprising by volume about 55% $H_2O$, 9% $H_2O_2$ and 36% $NH_4OH$ at a temperature of about 50° C.–60° C.

19. A method according to claim 18 wherein said wafers are immersed in said bath for about 2–5 minutes.

20. A method according to claim 13 wherein said wafers are heated with an infrared lamp to a temperature of about 45° C. or more during said spin-drying process.

21. A method for bonding at least two wafers wherein said at least two wafers includes at least one first semiconductor wafer and at least one second wafer comprising either a semiconductor material or glass wherein each of said wafers has at least one mirror-polished surface, including the steps of:

positioning said first and second wafers in closely spaced-apart and parallel relationship to each other and with each of said wafers having a mirror-polished surface opposing a mirror-polished surface of the other wafer;

cleansing said mirror-polished surfaces of said first and second wafers;

drying said mirror-polished surfaces of said first and second wafers;

moving said first and second wafers together so that contact occurs between said opposing mirror-polished surfaces of said first and second wafers.

22. A method according to claim 21 wherein said first wafer is a silicon wafer and said second wafer is a silicon wafer.

23. A method according to claim 21 wherein said first wafer is a silicon wafer and said second wafer is a glass wafer.

24. A method according to claim 23 wherein said glass wafer is a quartz wafer.

25. A method according to claim 21 wherein said wafers are spaced-apart about 10–1,000 um from each other.

26. A method according to claim 21 wherein the mirror-polished surfaces of said first and second wafers have been subjected to a hydrophilization treatment by the wafer manufacturer and said cleansing step comprises flushing said mirror-polished surfaces of said first and second wafers with water.

27. A method according to claim 21 wherein said cleansing step comprises introducing a cleansing solution onto the opposing mirror-polished surfaces of said first and second wafers and flushing said cleansing solution from said mirror-polished surfaces of said first and second wafers.

28. A method according to claim 27 wherein said cleansing solution is a hydrophilization bath comprising by volume about 55% $H_2O$, 9% $H_2O_2$ and 36% $NH_4OH$ at a temperature of about 50° C.–60° C.

29. A method according to claim 28 wherein said wafers are immersed in said hydrophilization bath for about 2–5 minutes.

30. A method according to claim 27 wherein said wafers are flushed with a stream of deionized water.

31. A method according to claim 27 wherein said wafers are dried by spin-drying.

32. A method according to claim 31 wherein said wafers are heated with an infrared lamp to a temperature of about 45° C. or more during said spin-drying process.

* * * * *